(12) United States Patent
Fiorenza et al.

(10) Patent No.: US 12,106,960 B2
(45) Date of Patent: Oct. 1, 2024

(54) ELECTRIC FIELD MANAGEMENT IN SEMICONDUCTOR DEVICES

(71) Applicant: Analog Devices, Inc., Wilmington, MA (US)

(72) Inventors: James G. Fiorenza, Carlisle, MA (US); Daniel Piedra, Somerville, MA (US)

(73) Assignee: Analog Devices, Inc., Wilmington, MA (US)

( * ) Notice: Subject to any disclaimer, the term of this patent is extended or adjusted under 35 U.S.C. 154(b) by 113 days.

(21) Appl. No.: 17/504,391

(22) Filed: Oct. 18, 2021

(65) Prior Publication Data

US 2023/0122090 A1    Apr. 20, 2023

(51) Int. Cl.
| | | |
|---|---|---|
| H01L 21/02 | (2006.01) | |
| H01L 29/20 | (2006.01) | |
| H01L 29/205 | (2006.01) | |
| H01L 29/66 | (2006.01) | |
| H01L 29/778 | (2006.01) | |

(52) U.S. Cl.
CPC .... *H01L 21/02694* (2013.01); *H01L 21/0245* (2013.01); *H01L 21/02488* (2013.01); *H01L 21/02502* (2013.01); *H01L 21/0254* (2013.01); *H01L 29/2003* (2013.01); *H01L 29/205* (2013.01); *H01L 29/66462* (2013.01); *H01L 29/7786* (2013.01)

(58) Field of Classification Search
CPC ............. H01L 29/205; H01L 29/66462; H01L 29/7786; H01L 21/02694; H01L 29/407; H01L 29/402; H01L 29/404; H01L 29/405
See application file for complete search history.

(56) References Cited

U.S. PATENT DOCUMENTS

| | | |
|---|---|---|
| 6,583,454 B2 | 6/2003 | Sheppard et al. |
| 6,602,764 B2 | 8/2003 | Linthicum et al. |
| 6,777,278 B2 | 8/2004 | Smith |

(Continued)

FOREIGN PATENT DOCUMENTS

| | | |
|---|---|---|
| CN | 104112658 A | 10/2014 |
| CN | 105244376 A | 1/2016 |

(Continued)

OTHER PUBLICATIONS

Chini, A, et al., "12 W/mm Power Density AlGaN/GaN HEMTs on Sapphire Substrate", Electronics Letters vol. 40, Issue 1, (Jan. 8, 2004), 2 pgs.

(Continued)

*Primary Examiner* — Nicholas J Tobergte
*Assistant Examiner* — Adin Hrnjic
(74) *Attorney, Agent, or Firm* — Schwegman Lundberg & Woessner, P.A.

(57) ABSTRACT

Electric field management techniques in GaN based semiconductors that utilize patterned regions of differing conductivity under the active GaN device, such as a GaN high electron mobility transistor (HEMT), are described. As an example, a patterned layer of oxidized silicon can be formed superjacent a layer of silicon dioxide during or prior to the heteroepitaxy of GaN or another semiconductor material. These techniques can be useful for back-side electric field management because a silicon layer, for example, can be made conductive to act as a back-side field plate.

9 Claims, 7 Drawing Sheets

(56) References Cited

U.S. PATENT DOCUMENTS

| | | |
|---|---|---|
| 7,378,684 B2 | 5/2008 | Linthicum et al. |
| 7,420,226 B2 | 9/2008 | Augustine et al. |
| 8,076,694 B2 | 12/2011 | Narukawa et al. |
| 9,093,271 B2 | 7/2015 | Schenk et al. |
| 9,660,064 B2 | 5/2017 | Dasgupta et al. |
| 9,735,292 B2 | 8/2017 | Yvon |
| 9,793,389 B1 | 10/2017 | Chern et al. |
| 9,978,852 B2 | 5/2018 | Renaud |
| 10,283,501 B2 | 5/2019 | Macelwee et al. |
| 10,290,730 B1* | 5/2019 | Yang ................. H01L 29/66462 |
| 10,600,645 B2 | 3/2020 | Kim et al. |
| 2002/0069816 A1 | 6/2002 | Gehrke et al. |
| 2012/0187451 A1* | 7/2012 | Saito ..................... H01L 29/808 |
| | | 257/192 |
| 2014/0042448 A1 | 2/2014 | Ostermaier et al. |
| 2015/0295051 A1 | 10/2015 | Donkers et al. |
| 2018/0330941 A1* | 11/2018 | Feuillet ............... H01L 21/0254 |
| 2020/0013862 A1 | 1/2020 | Srivastava et al. |
| 2021/0083083 A1 | 3/2021 | Huang |
| 2021/0126120 A1* | 4/2021 | Piedra ................. H01L 29/1608 |
| 2021/0273084 A1 | 9/2021 | Chen et al. |

FOREIGN PATENT DOCUMENTS

| | | |
|---|---|---|
| CN | 110634861 A | 12/2019 |
| CN | 112993029 A | 6/2021 |
| CN | 118120062 | 5/2024 |
| EP | 2879184 A1 | 6/2015 |
| JP | 2007246289 A | 9/2007 |
| JP | 5433909 B2 | 12/2013 |
| KR | 100382461 B1 | 5/2003 |
| KR | 101152989 B1 | 6/2012 |
| WO | WO-2018039316 A1 | 3/2018 |
| WO | WO-2023069796 A1 | 4/2023 |

OTHER PUBLICATIONS

Comyn, Remi, et al., "AlGaN/GaN/AlGaN DH-HEMTs Grown on a Patterned Silicon Substrate", Applications and Materials Science vol. 215, Issue 9, (Nov. 14, 2017), 6 pgs.

Jia, Shuo, et al., "AlGaN—GaN HEMTs on Patterned Silicon (111) Substrate", IEEE Electron Device Letters, vol. 26, No. 3, (Mar. 2005), 130-132.

Pal, S, et al., "Silicon—A New Substrate for GaN Growth", Bull. Mater. Sci., vol. 27, No. 6, (Dec. 2004), 501-504.

Yang, Zhenchuan, et al., "GaN-on-Patterned-Silicon (GPS) Technique for Fabrication of GaN-based MEMS", Sensors and Actuators A 130-131, (Jan. 20, 2006), 371-378.

"International Application Serial No. PCT/US2022/073225, International Search Report mailed Oct. 25, 2022", 3 pgs.

"International Application Serial No. PCT/US2022/073225, Written Opinion mailed Oct. 25, 2022", 6 pgs.

"International Application Serial No. PCT/US2022/073225, International Preliminary Report on Patentability mailed May 2, 2024", 8 pgs.

* cited by examiner

ELECTRIC FIELD MANAGEMENT IN SEMICONDUCTOR DEVICES

FIELD OF THE DISCLOSURE

This document pertains generally, but not by way of limitation, to semiconductor devices, and more particularly, to techniques for constructing gallium nitride devices.

BACKGROUND

Gallium nitride (GaN) based semiconductors offer several advantages over other semiconductors as the material of choice for fabricating the next generation of transistors, or semiconductor devices, for use in both high voltage and high frequency applications. GaN based semiconductors, for example, have a wide bandgap that enable devices fabricated from these materials to have a high breakdown electric field and to be robust to a wide range of temperatures.

The two-dimensional electron gas (2DEG) channels formed by GaN based heterostructures generally have high electron mobility, making devices fabricated using these structures useful in power-switching and amplification systems. GaN based semiconductors, however, are typically used to fabricate depletion mode (or normally on) devices, which can have limited use in many of these systems, such as due to the added circuit complexity required to support such devices.

SUMMARY OF THE DISCLOSURE

Electric field management techniques in GaN based semiconductors that utilize patterned regions of differing conductivity under the active GaN device, such as a GaN high electron mobility transistor (HEMT), are described. As an example, a patterned layer of oxidized silicon can be formed superjacent a layer of silicon dioxide during or prior to the heteroepitaxy of GaN or another semiconductor material. These techniques can be useful for back-side electric field management because a silicon layer, for example, can be made conductive to act as a back-side field plate.

In some aspects, this disclosure is directed to a method of forming a compound semiconductor heterostructure transistor device, the method comprising: forming an insulator layer over a substrate; forming a crystal lattice layer over the insulator layer; implanting a material in the crystal lattice layer; selectively etching a region of the crystal lattice layer; forming a first semiconductor material layer over the crystal lattice layer; and forming a second semiconductor material layer over the first semiconductor material layer to form a compound semiconductor heterostructure having a two-dimensional electron gas (2DEG) channel, wherein the 2DEG channel is more conductive than either the first semiconductor material layer or the second semiconductor material layer.

In some aspects, this disclosure is directed to a compound semiconductor heterostructure transistor device comprising: an insulator layer formed over a substrate; a crystal lattice layer formed over the insulator layer, wherein the crystal lattice layer includes an etched away portion, and wherein the crystal lattice layer is implanted with a material; and a first semiconductor material layer formed over a second semiconductor material layer to form a compound semiconductor heterostructure having a two-dimensional electron gas (2DEG) channel, wherein the 2DEG channel is more conductive than either the first semiconductor material layer or the second semiconductor material layer, and wherein the second semiconductor material layer is formed over the crystal lattice layer that has been oxidized.

In some aspects, this disclosure is directed to a compound semiconductor heterostructure transistor device comprising: an insulator layer formed over a substrate; a silicon layer formed over the insulator layer, wherein the silicon layer includes an etched away portion, and wherein the silicon layer is implanted with a material; and a first semiconductor material layer formed over a second semiconductor material layer to form a compound semiconductor heterostructure having a two-dimensional electron gas (2DEG) channel, wherein the 2DEG channel is more conductive than either the first semiconductor material layer or the second semiconductor material layer, and wherein the second semiconductor material layer is formed over the silicon layer that has been oxidized.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Gallium nitride (GaN) based semiconductors are an attractive option for high frequency and high-power applications. GaN technology, however, still has challenges with managing the high electric fields present in the device. Presently, top-side field plates (which are also referred to as front-side field plates) are the primary technique used to reduce the electric field to protect the device. Silicon power devices can use both back-side and top-side field plates, which can be more effective at electric field management than using only top-side field plates.

This disclosure describes electric field management techniques in GaN based semiconductors that utilize patterned regions of differing conductivity under the active GaN device, such as a GaN high electron mobility transistor (HEMT). As an example, a patterned layer of oxidized silicon can be formed superjacent a layer of silicon dioxide during or prior to the heteroepitaxy of GaN or another semiconductor material. These techniques can be useful for back-side electric field management because a silicon layer, for example, can be made conductive to act as a back-side field plate.

As used in this disclosure, a GaN-based compound semiconductor material can include a chemical compound of elements including GaN and one or more elements from different groups in the periodic table. Such chemical compounds can include a pairing of elements from group 13 (i.e., the group comprising boron (B), aluminum (Al), gallium (Ga), indium (In), and thallium (Tl)) with elements from group 15 (i.e., the group comprising nitrogen (N), phosphorus (P), arsenic (As), antimony (Sb), and bismuth (Bi)). Group 13 of the periodic table can also be referred to as Group III and group 15 as Group V. In an example, a semiconductor device can be fabricated from GaN and aluminum indium gallium nitride (AlInGaN).

Heterostructures described herein can be formed as AlN/GaN/AlN heterostructures, InAlN/GaN heterostructures, AlGaN/GaN heterostructures, or heterostructures formed from other combinations of group 13 and group 15 elements. These heterostructures can form a two-dimensional electron gas (2DEG) at the interface of the compound semiconductors that form the heterostructure, such as the interface of GaN and AlGaN. The 2DEG can form a conductive channel of electrons that can be controllably depleted, such as by an electric field formed by a buried layer of p-type material disposed below the channel. The conductive channel of electrons that can also be controllably enhanced, such as by an electric field formed by a gate terminal disposed above the channel to control a current through the semiconductor device. Semiconductor devices formed using such conductive channels can include high electron mobility transistors.

Figure 1A:
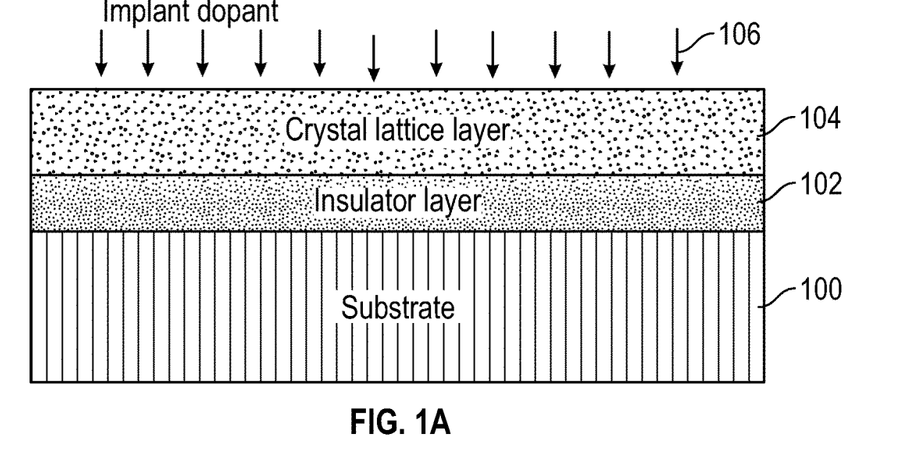
FIGS. 1A-1E depict an example of a process fabrication flow of forming a compound semiconductor heterostructure transistor device in accordance with various techniques of this disclosure.

FIGS. 1A-1E depict an example of a process fabrication flow of forming a compound semiconductor heterostructure transistor device in accordance with various techniques of this disclosure. FIG. 1A depicts the starting materials that can be used in a first example flow. The example shown includes a substrate 100, an insulator layer 102 formed over the substrate 100, and a crystal lattice layer 104 formed over the insulator layer 102. Examples of the substrate 100 can include silicon-on-insulator (SOI), aluminum nitride (AlN), and polycrystalline silicon carbide (SiC). Examples of the insulator layer 102 can include silicon dioxide ($SiO_2$), silicon nitride ($Si_3N_4$), and aluminum oxide ($Al_2O_3$).

The crystal lattice layer 104 can include materials with a crystal lattice and that are configured to allow growth of another superjacent crystal lattice. Examples of the crystal lattice layer 104 can include silicon and sapphire, which can allow formation of another crystal lattice layer, such as a GaN layer, superjacent the crystal lattice layer 104. A crystal lattice layer is in contrast to an amorphous layer, which would not allow growth of a superjacent crystal lattice.

As mentioned above, back-side field plates can be used to manage the high electric fields that are often present in GaN devices. As described below and in contrast to other techniques, the techniques of this disclosure can use the crystal lattice layer 104 to form a back-side field plate, which can be less expensive than implanted silicon carbide, for example.

The conductivity of a back-side field plate is a factor in controlling the electric fields in a GaN device. As illustrated by the arrows 106 in FIG. 1A, a material can be implanted in the crystal lattice layer 104. In some examples, the material can be a dopant that is implanted in order to tune the conductivity of the crystal lattice layer 104 to reach a desired sheet resistance to effectively control the electric fields in the device. Examples of dopants can include boron, nitrogen, and aluminum. In a non-limiting example, a range of concentrations of a dopant can be between about 1E12 $cm^{-2}$ and about 1E18 $cm^{-2}$.

Figure 1B:
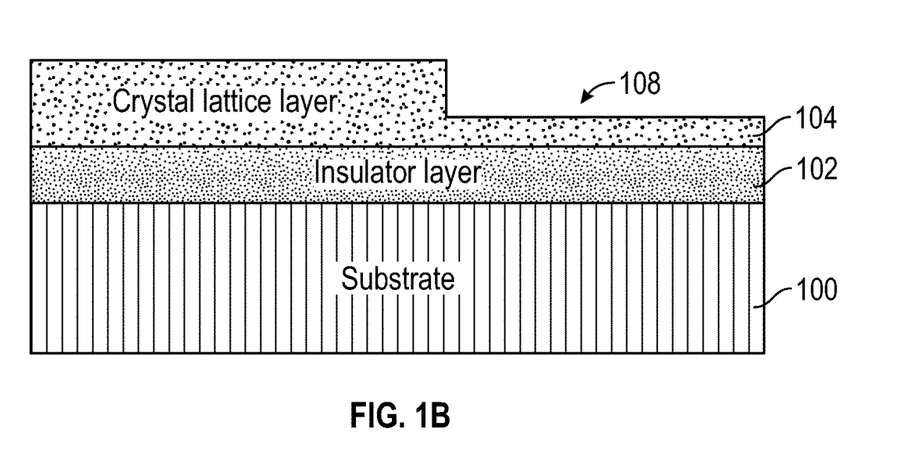

Referring to FIG. 1B, the process flow can include patterning a region of the crystal lattice layer 104 where a back-side field plate is desired. Then, the patterned region can be selectively etched away, as shown at 108.

Figure 1C:
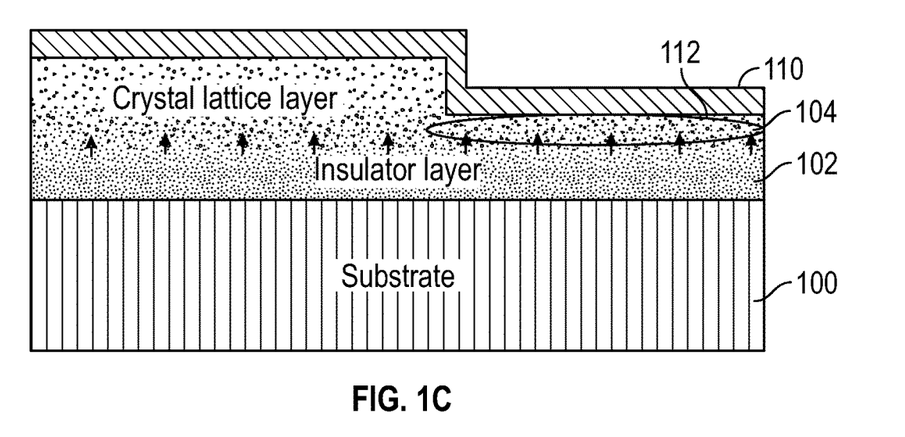

Referring to FIG. 1C, a first semiconductor material layer 110 can be formed over the crystal lattice layer 104. For example, the structure of FIG. 1B can be placed in a reactor and a first semiconductor material layer 110 can be formed, e.g., grown, over the crystal lattice layer 104. In some examples, the first semiconductor material layer 110 can be GaN and can be formed in the reactor at an elevated temperature between about 800 degrees Celsius and about 1100 degrees Celsius, for example.

Figure 1D:
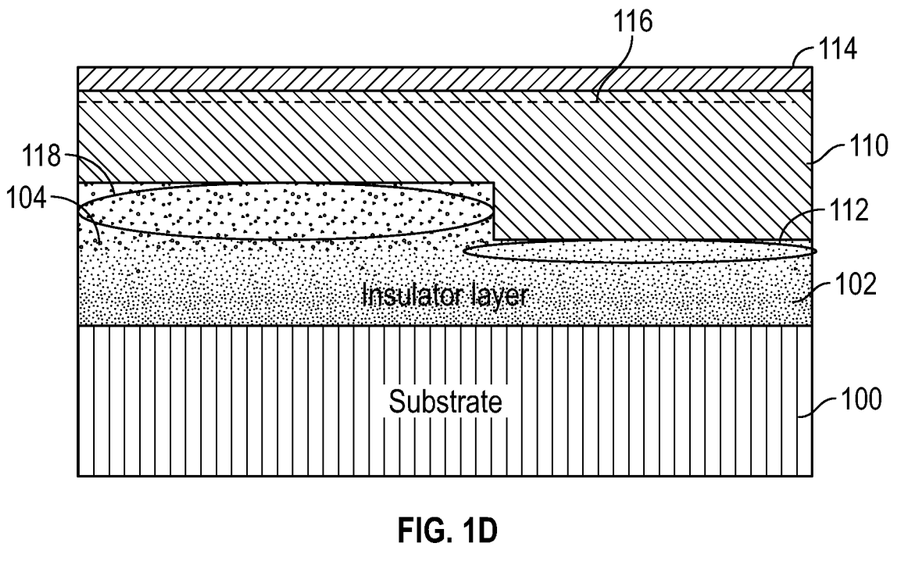

At the elevated temperature, the crystal lattice layer 104 at the interface of the insulator layer 102 and the crystal lattice layer 104 can begin to oxidize. For example, the crystal lattice layer 104 can be silicon and the insulator layer 102 can be silicon dioxide. In such an example, the silicon at the interface with the silicon dioxide can begin to oxidize at the elevated temperature in the reactor and can become silicon dioxide. As the growth of the first semiconductor material layer 110 proceeds, more and more of the crystal lattice layer 104, e.g., silicon, becomes silicon dioxide. Eventually, most or all of the crystal lattice layer 104 in the region 112 can be oxidized, as shown in FIG. 1D. For example, most or all of a silicon layer can become silicon dioxide in the region 112. Such a technique is important because GaN cannot be grown directly on silicon dioxide, for example.

Referring to FIG. 1D, the first semiconductor material layer 110 can be further formed. Then, a second semiconductor material layer 114 can be formed, e.g., grown, over the first semiconductor material layer 110 to form a compound semiconductor heterostructure having a two-dimensional electron gas (2DEG) 2DEG channel 116 (represented by a dashed line), where the 2DEG channel is more conductive than either the first semiconductor material layer 110 or the second semiconductor material layer 114.

In a non-limiting example, the first semiconductor material layer 110, such as GaN, can have a thickness of about 100 nm to about 600 nm, and the second semiconductor material layer 114, such as AlGaN, can have a thickness of about nm to about 30 nm. In some examples, GaN growth on Si can have a nucleation layer, such as AlN or AlGaN or some superlattice of different aluminum content of AlGaN layers. In some examples, the crystal lattice layer, such as silicon, can have a thickness of less than about 100 nm so that there is not too large of a step in the etch.

As seen in FIG. 1D, most or all of the crystal lattice layer 104 in the region 112 has been consumed and turned into the insulator layer 102. For example, most or all of the silicon in the region 112 has been consumed and turned into silicon dioxide. As a result, only the patterned, higher conductivity region 118 of the crystal lattice layer 104 remains. In this manner, a patterned, higher conductivity region 118 can be created above an insulator, namely the insulator layer 102. The patterned, higher conductivity region 118 can be used as a back-side field plate.

Figure 1E:
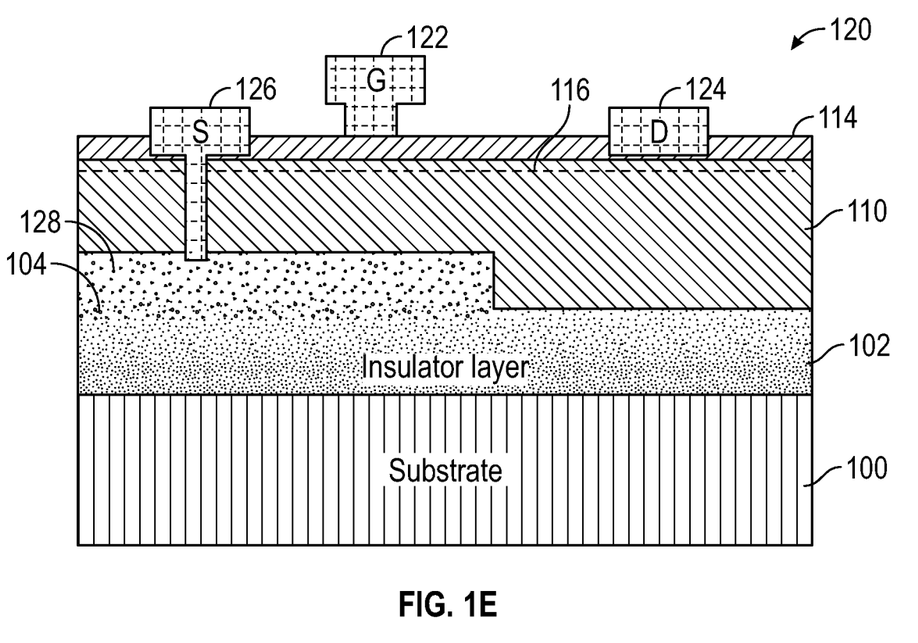

Referring to FIG. 1E, a compound semiconductor heterostructure transistor device 120 is shown having a back-side field plate 128. The compound semiconductor heterostructure transistor device 120 can include a gate contact 122, e.g., a T-gate contact, a drain contact 124, and a source contact 126. The gate contact 122 can be in contact with the second semiconductor material layer 114. The drain contact 124 and the source contact 126 can be in contact with the second semiconductor material layer 114 or the 2DEG channel 116.

In some examples, it can be desirable to further promote the oxidation at the interface between the crystal lattice layer 104 and the insulator layer 102. As such, it can be desirable to implant oxygen, as shown and described below with respect to FIGS. 2A-2E.

Figure 2A:
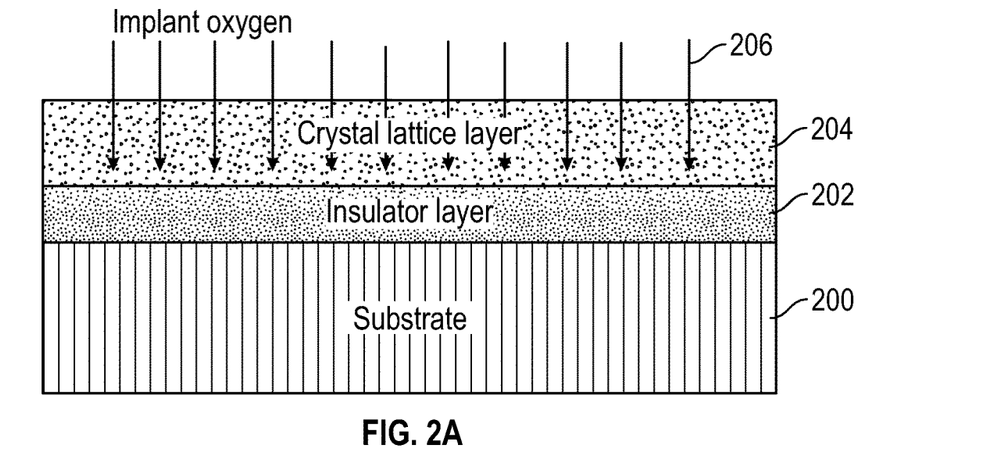
FIGS. 2A-2E depict another example of a process fabrication flow of forming a compound semiconductor heterostructure transistor device in accordance with various techniques of this disclosure.

FIGS. 2A-2E depict another example of a process fabrication flow of forming a compound semiconductor heterostructure transistor device in accordance with various techniques of this disclosure. FIG. 2A depicts the starting materials that can be used in an example flow. The example shown includes a substrate 200, an insulator layer 202 formed over the substrate 200, and a crystal lattice layer 204 formed over the insulator layer 202. The substrate 200, the insulator layer 202, and the crystal lattice layer 204 are similar to those in FIGS. 1A-IE and, for purposes of conciseness, will not be described in detail again.

Rather than relying solely on the elemental oxygen in the insulator layer, such as silicon dioxide, oxygen can be implanted in the crystal lattice layer 204, such as silicon, as illustrated by the arrows 206 in FIG. 2A. The implanted oxygen can provide an additional supply of oxygen to promote the oxidation of the crystal lattice layer 204 at the interface of the crystal lattice layer 204 and the insulator layer 202. The implantation can be tuned such that there is a high concentration of oxygen, such as between about 1E12 $cm^{-2}$ and about 1E19 $cm^{-2}$, at the interface of the crystal lattice layer 204 and the insulator layer 202, where the oxidation is desired.

Figure 2B:
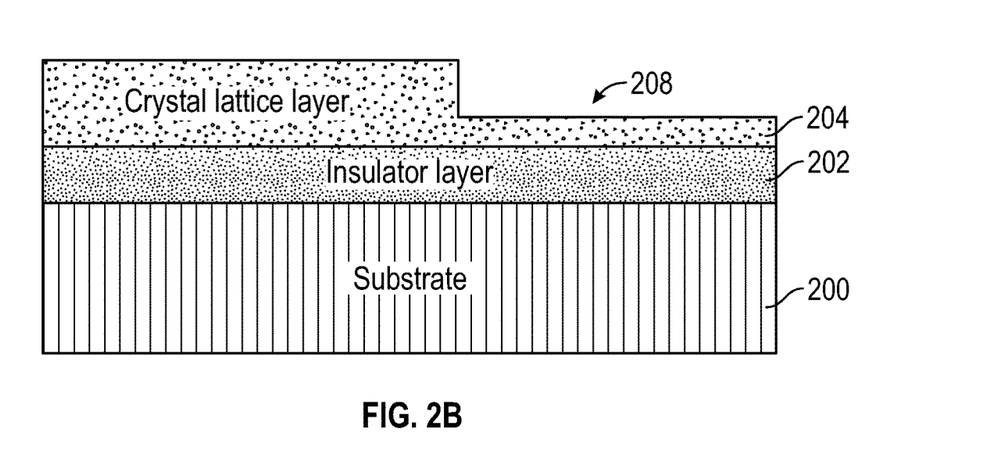

FIG. 2B is similar to FIG. 1B. The process flow can include patterning a region of the crystal lattice layer 204 where a back-side field plate is desired. Then, the patterned region can be selectively etched away, as shown at 208.

Figure 2C:
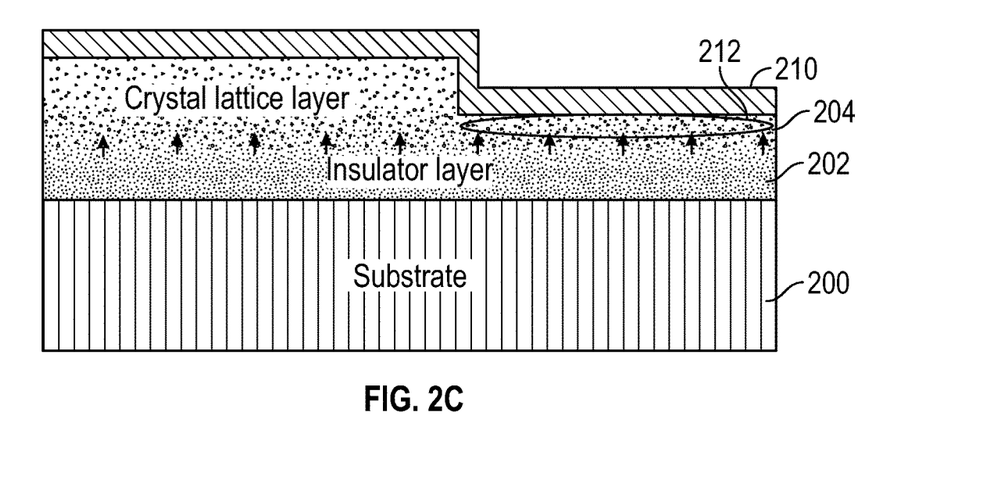
Figure 2D:
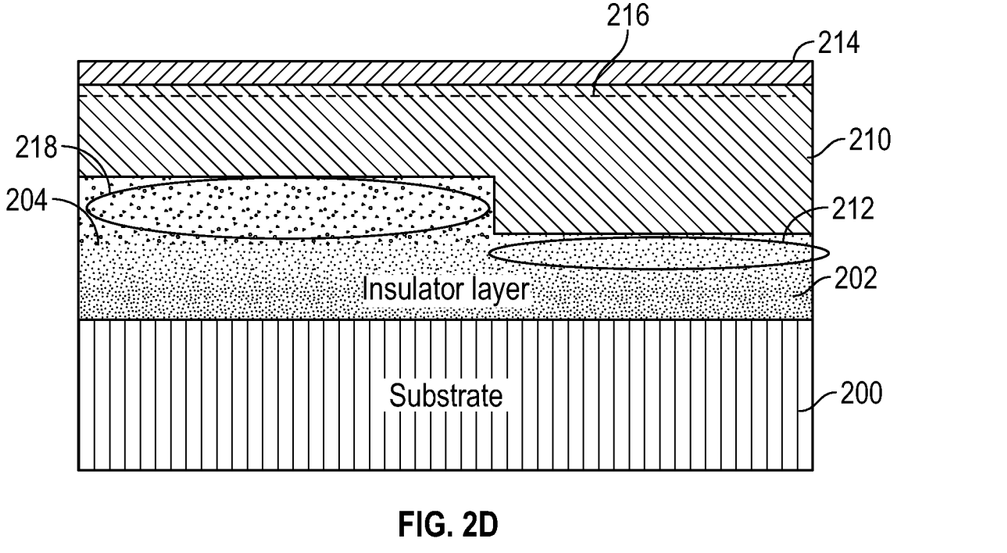

FIG. 2C is similar to FIG. 1C and, for purposes of conciseness, will not be described in detail again. At an elevated temperature, the crystal lattice layer 204 at the interface of the insulator layer 202 and the crystal lattice layer 204 can begin to oxidize due to either or both of oxygen in the insulator layer 202 or the implanted oxygen from FIG. 2A. As before, most or all of the crystal lattice layer 204 in the region 212 can be oxidized, as shown in FIG. 2D. For example, most or all of a silicon layer can become silicon dioxide in the region 212.

FIG. 2D is similar to FIG. 1D and, for purposes of conciseness, will not be described in detail again. The first semiconductor material layer 210 can be further formed. Then, a second semiconductor material layer 214 can be formed, e.g., grown, over the first semiconductor material layer 210 to form a compound semiconductor heterostructure having a two-dimensional electron gas (2DEG) 2DEG channel 216 (represented by a dashed line), where the 2DEG channel is more conductive than either the first semiconductor material layer 210 or the second semiconductor material layer 214. As seen in FIG. 2D, most or all of the crystal lattice layer 204 in the region 212 has been consumed and turned into the insulator layer 202. For example, most or all of the silicon in the region 212 has been consumed and turned into silicon dioxide. As a result, only the patterned, higher conductivity region 218 of the crystal lattice layer 204 remains. In this manner, a patterned, higher conductivity region 218 can be created above an insulator, namely the insulator layer 202. The patterned, higher conductivity region 218 can be used as a back-side field plate.

Figure 2E:
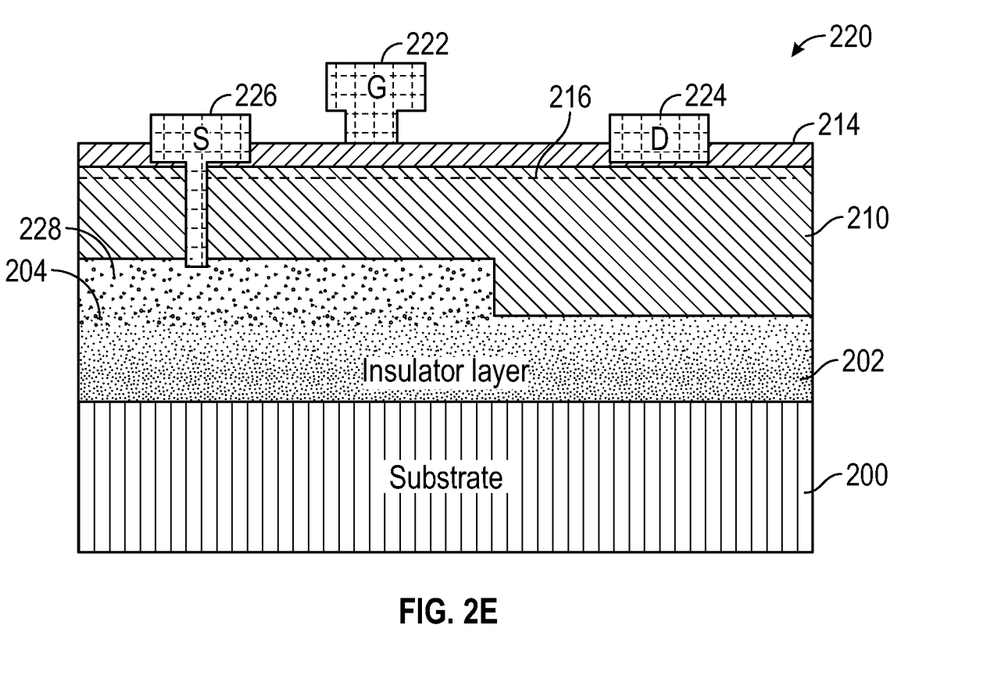

Referring to FIG. 2E, a compound semiconductor heterostructure transistor device 220 is shown having a back-side field plate 228. The compound semiconductor heterostructure transistor device 220 can include a gate contact 222, e.g., a T-gate contact, a drain contact 224, and a source contact 226. The gate contact 222 can be in contact with the second semiconductor material layer 214. The drain contact 224 and the source contact 226 can be in contact with the second semiconductor material layer 214 or the 2DEG channel 216.

In some examples, it can be desirable to both tune the conductivity of a crystal lattice layer and further promote the oxidation at the interface between the crystal lattice layer and the insulator layer. As such, it can be desirable to implant a dopant, as in FIG. 1A, and implant oxygen, as in FIG. 2A. In an example of such a process flow is shown and described below with respect to FIGS. 3A-3E.

Figures 3A, 3B:
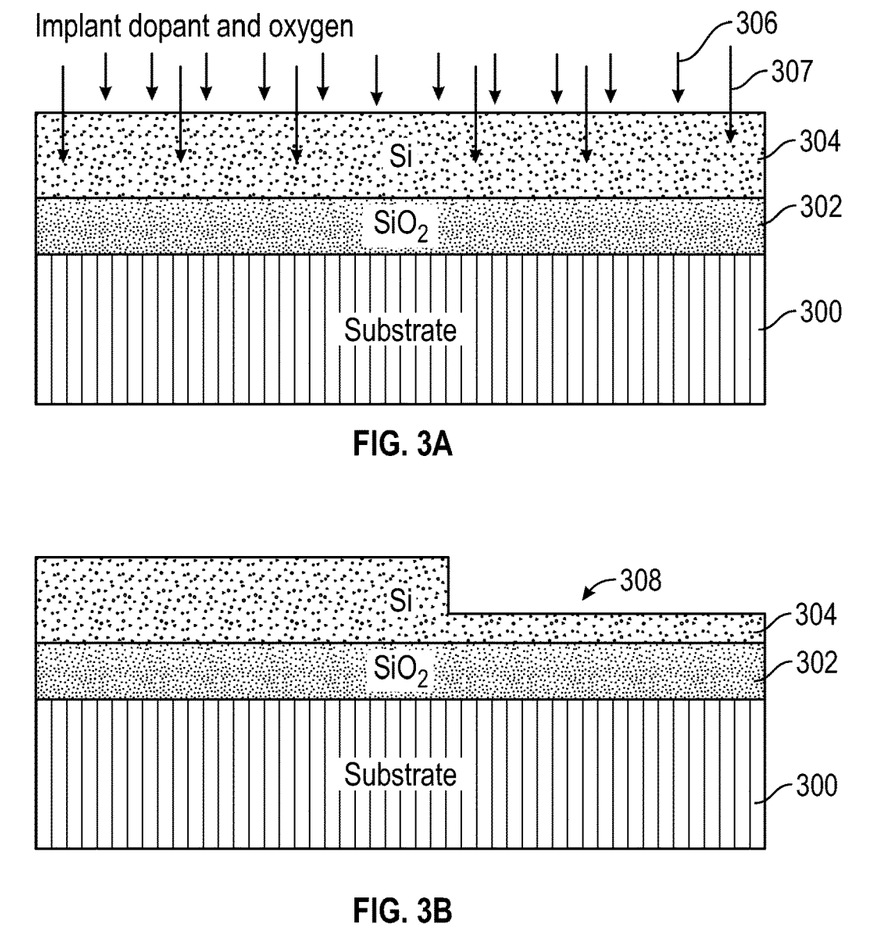
FIGS. 3A-3E depict another example of a process fabrication flow of forming a compound semiconductor heterostructure transistor device in accordance with various techniques of this disclosure.

FIGS. 3A-3E depict another example of a process fabrication flow of forming a compound semiconductor heterostructure transistor device in accordance with various techniques of this disclosure. FIG. 3A depicts the starting materials that can be used in an example flow. The example shown includes a substrate 300, a silicon dioxide layer 302 formed over the substrate 300, and a silicon layer 304 formed over the silicon dioxide layer 302. The substrate 300 is similar to the substrate 100 of FIG. 1A, for example, and the silicon dioxide layer 302 and the silicon layer 304 are examples of the insulator layer and the crystal lattice layer described above and, for purposes of conciseness, will not be described in detail again.

As illustrated by the arrows 306 in FIG. 3A, a material can be implanted in the silicon layer 304. In some examples, the material can be a dopant that is implanted in order to tune the conductivity of the silicon layer 304 to reach a desired sheet resistance to effectively control the electric fields in the device. Examples of dopants can include boron, nitrogen, and aluminum.

In addition, oxygen can be implanted in the silicon layer 304, as illustrated by the arrows 307 in FIG. 3A. The implanted oxygen can provide an additional supply of oxygen to promote the oxidation of the silicon layer 304 at the interface of the silicon layer 304 and the silicon dioxide layer 302, as described above with respect to FIG. 2A.

Referring to FIG. 3B, the process flow can include patterning a region of the silicon layer 304 where a back-side field plate is desired. Then, the patterned region can be selectively etched away, as shown at 308.

Figure 3C:
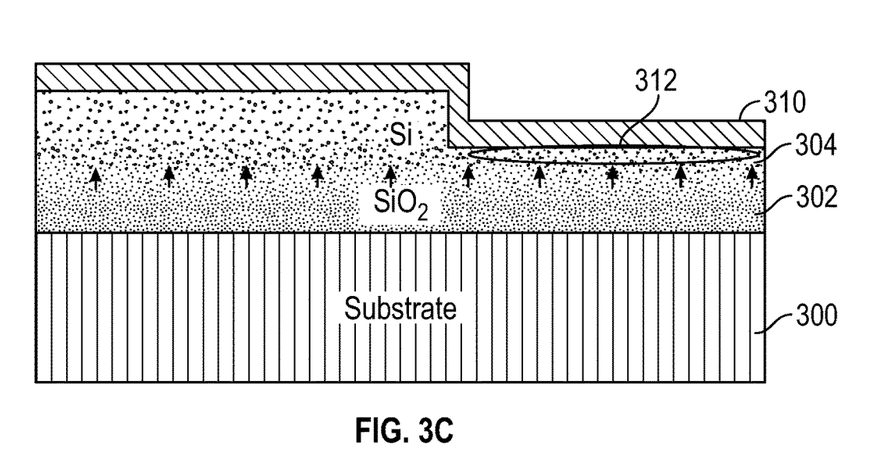

FIG. 3C is similar to FIG. 1C and, for purposes of conciseness, will not be described in detail again. At an elevated temperature, the silicon layer 304 at the interface of the silicon dioxide layer 302 and the silicon layer 304 can begin to oxidize due to either or both of oxygen in the silicon dioxide layer 302 or the implanted oxygen from FIG. 3A. As before, most or all of the silicon layer 304 in the region 312 can be oxidized, as shown in FIG. 3D.

Figure 3D:
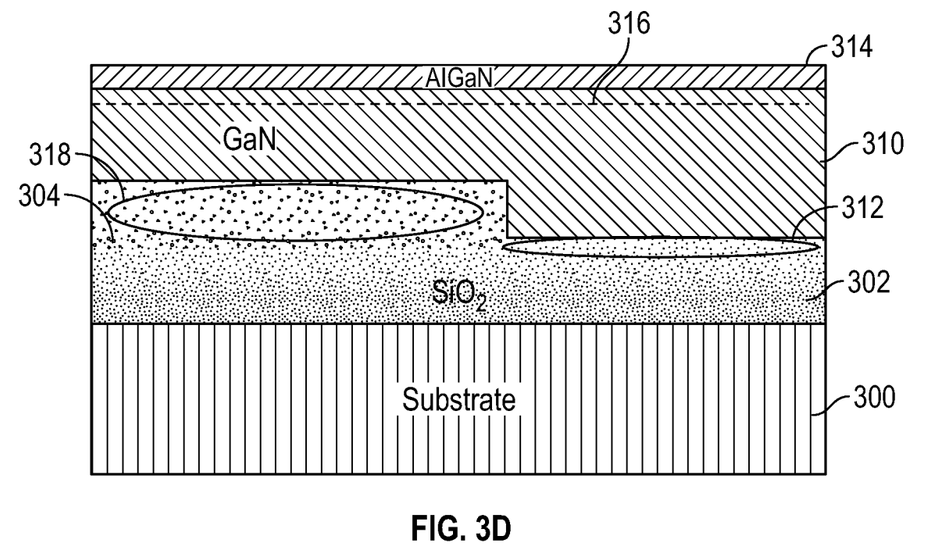

FIG. 3D is similar to FIG. 1D and, for purposes of conciseness, will not be described in detail again. The first semiconductor material layer 310, e.g., GaN, can be further formed. Then, a second semiconductor material layer 314, e.g., AlGaN, can be formed, e.g., grown, over the first semiconductor material layer 310 to form a compound semiconductor heterostructure having a two-dimensional electron gas (2DEG) 2DEG channel 316 (represented by a dashed line), where the 2DEG channel is more conductive than either the first semiconductor material layer 310 or the second semiconductor material layer 314. As seen in FIG. 3D, most or all of the crystal lattice layer 304 in the region 312 has been consumed and turned into the insulator layer 302. For example, most or all of the silicon in the region 312 has been consumed and turned into silicon dioxide. As a result, only the patterned, higher conductivity region 318 of the crystal lattice layer 304 remains. In this manner, a patterned, higher conductivity region 318 can be created above an insulator, namely the insulator layer 302. The patterned, higher conductivity region 318 can be used as a back-side field plate.

Figure 3E:
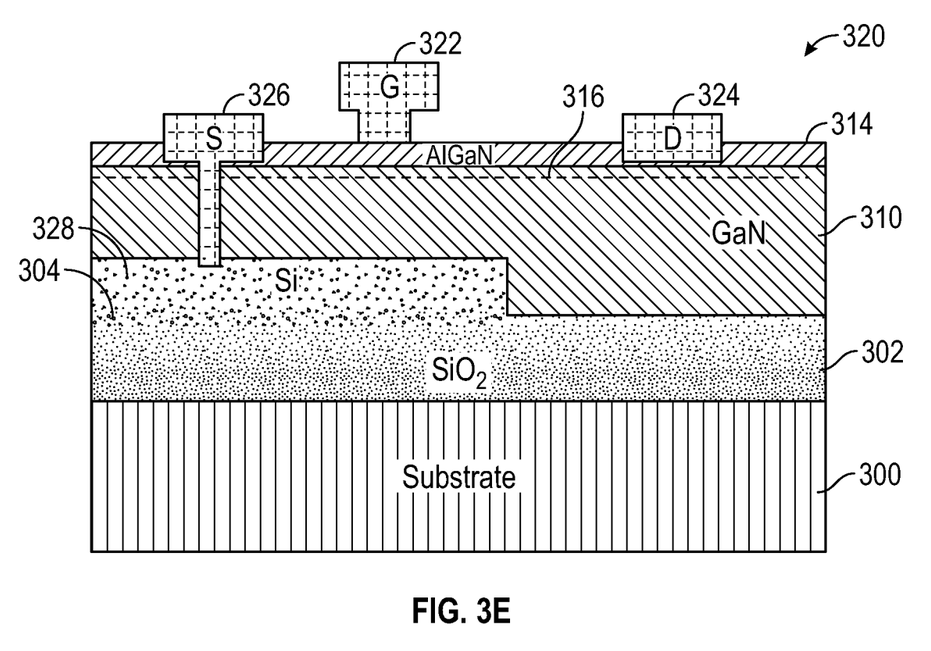

Referring to FIG. 3E, a compound semiconductor heterostructure transistor device 320 is shown having a back-side field plate 328. The compound semiconductor heterostructure transistor device 320 can include a gate contact 322, e.g., a T-gate contact, a drain contact 324, and a source contact 326. The gate contact 322 can be in contact with the second semiconductor material layer 314. The drain contact 324 and the source contact 326 can be in contact with the second semiconductor material layer 314 or the 2DEG channel 316.

Figure 4:
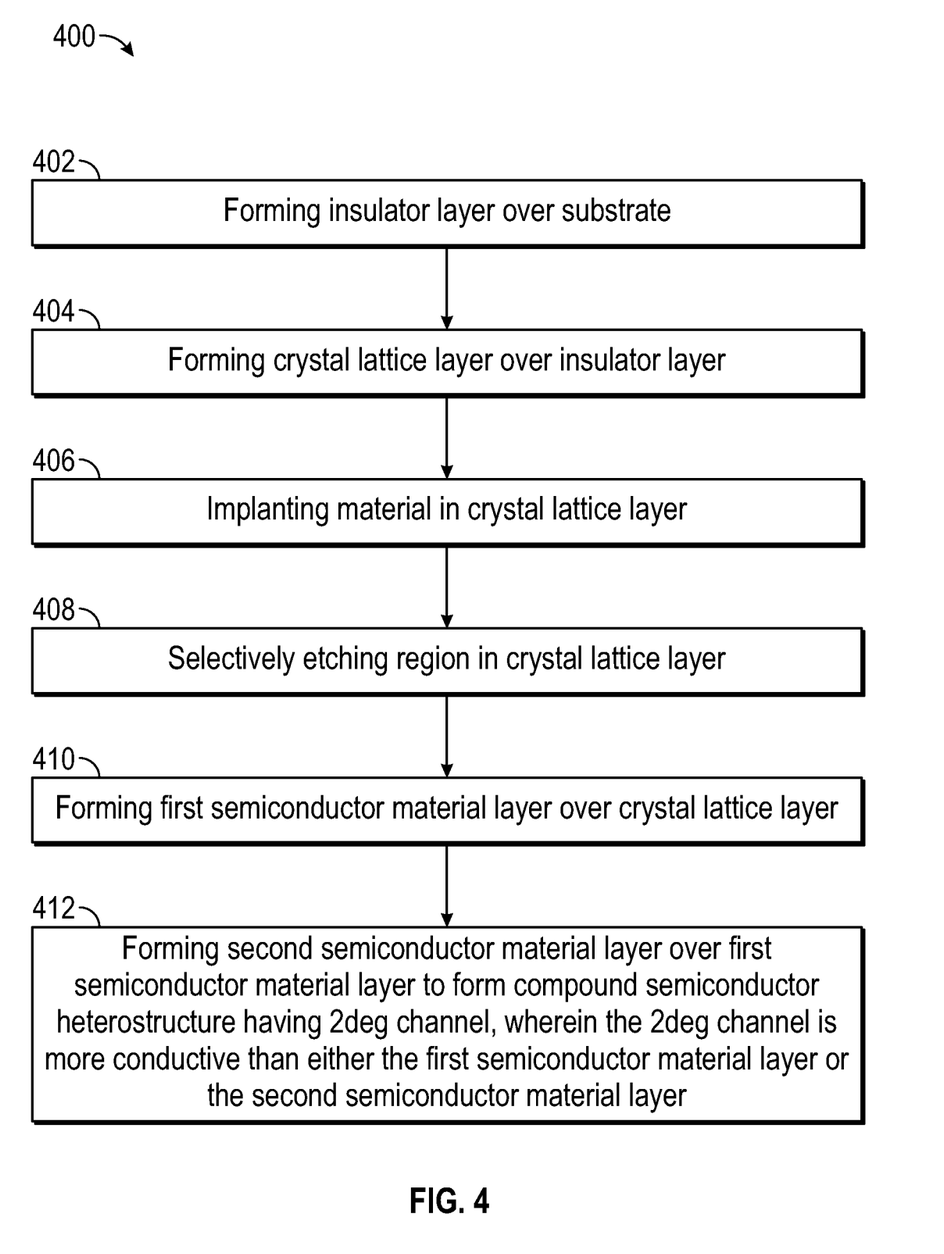
FIG. 4 is an example of a flow diagram of a method 400 of forming a compound semiconductor heterostructure transistor device, in accordance with various techniques of this disclosure.

FIG. 4 is an example of a flow diagram of a method 400 of forming a compound semiconductor heterostructure transistor device, in accordance with various techniques of this disclosure. At block 402, the method 400 can include forming an insulator layer over a substrate. For example, the method 400 can include forming an insulator layer of silicon dioxide, silicon nitride, or aluminum oxide over a substrate of silicon-on-insulator, aluminum nitride, or polycrystalline silicon carbide, for example.

At block 404, the method 400 can include forming a crystal lattice layer over the insulator layer. For example, a layer of silicon or sapphire can be formed over the insulator layer.

At block 406, the method 400 can include implanting a material in the crystal lattice layer. In some examples, implanting the material can include implanting a dopant, such as boron, nitrogen, or aluminum, to adjust a conductivity of the crystal lattice layer. In some examples, implanting the material in the crystal lattice layer can include implanting oxygen in the crystal lattice layer to adjust a concentration of the oxygen at an interface between the silicon dioxide layer and the crystal lattice layer. In some examples, implanting the material in the crystal lattice layer can include both implanting a dopant in the crystal lattice layer and implanting oxygen in the crystal lattice layer.

At block 408, the method 400 can include selectively etching a region of the crystal lattice layer.

At block 410, the method 400 can include forming a first semiconductor material layer over the crystal lattice layer. For example, a GaN layer can be formed over a silicon layer. In some examples, the method can include oxidizing the crystal lattice layer at an interface between the silicon dioxide layer and the crystal lattice layer.

At block 412, the method 400 can include forming a second semiconductor material layer over the first semiconductor material layer to form a compound semiconductor heterostructure having a two-dimensional electron gas (2DEG) channel, where the 2DEG channel is more conductive than either the first semiconductor material layer or the second semiconductor material layer. For example, a layer of aluminum gallium nitride (AlGaN) can be formed over a layer of GaN.

The method 400 can include forming a gate contact in contact with the second semiconductor material layer, e.g., AlGaN, and forming drain and source contacts in contact with the second semiconductor material layer, e.g., AlGaN, or the 2DEG channel.

VARIOUS NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A compound semiconductor heterostructure transistor device comprising:
   an insulator layer formed over a substrate;
   a crystal lattice layer formed over the insulator layer, wherein the crystal lattice layer has been oxidized and includes a first portion and a second, etched away portion, and wherein the crystal lattice layer is implanted with a material; and
   a first semiconductor material layer formed over a second semiconductor material layer to form a compound semiconductor heterostructure having a two-dimensional electron gas (2DEG) channel, wherein the 2DEG channel is more conductive than either the first semiconductor material layer or the second semiconductor material layer, and wherein the second semiconductor material layer is formed over the crystal lattice layer;
   a gate contact in contact with the first semiconductor material layer; and
   drain and source contacts in contact with the first semiconductor material layer or the 2DEG channel,
   a backside field plate including the first portion of the crystal lattice layer, wherein the first portion extends laterally from a region underlying the source contact to a region between the gate contact and the drain contact.

2. The compound semiconductor heterostructure transistor device of claim 1, wherein the crystal lattice layer includes a silicon layer.

3. The compound semiconductor heterostructure transistor device of claim 1, wherein the insulator layer includes a silicon dioxide layer.

4. The compound semiconductor heterostructure transistor device of claim 1, wherein the implanted material includes a dopant to adjust a conductivity of the crystal lattice layer.

5. The compound semiconductor heterostructure transistor device of claim 4, wherein the dopant includes at least one of boron, nitrogen, or aluminum.

6. The compound semiconductor heterostructure transistor of claim 1, wherein the implanted material includes oxygen to adjust a concentration of the oxygen at an interface between the insulator layer and the crystal lattice layer.

7. The compound semiconductor heterostructure transistor of claim 1, wherein the second semiconductor material layer includes gallium nitride, and wherein the first semiconductor material layer includes aluminum gallium nitride.

8. A compound semiconductor heterostructure transistor device comprising:
   an insulator layer formed over a substrate;
   a silicon layer formed over the insulator layer, wherein the silicon layer has been oxidized and includes a first portion and a second, etched away portion, and wherein the silicon layer is implanted with a material; and
   a first semiconductor material layer formed over a second semiconductor material layer to form a compound semiconductor heterostructure having a two-dimensional electron gas (2DEG) channel, wherein the 2DEG channel is more conductive than either the first semiconductor material layer or the second semiconductor material layer, and wherein the second semiconductor material layer is formed over the silicon layer;
   a gate contact in contact with the first semiconductor material layer; and
   drain and source contacts in contact with the first semiconductor material layer or the 2DEG channel,
   a backside field plate including the first portion of the silicon layer, wherein the first portion extends laterally from a region underlying the source contact to a region between the gate contact and the drain contact.

9. The compound semiconductor heterostructure transistor device of claim 8, wherein the silicon layer is implanted with a dopant to adjust a conductivity of the silicon layer.

* * * * *